(12) United States Patent
Lee et al.

(10) Patent No.: US 11,715,708 B2
(45) Date of Patent: *Aug. 1, 2023

(54) SEMICONDUCTOR PACKAGE INCLUDING DECOUPLING CAPACITOR

(71) Applicant: SK hynix Inc., Icheon-si (KR)

(72) Inventors: Jae Hoon Lee, Icheon-si (KR); Hyung Ho Cho, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/498,177

(22) Filed: Oct. 11, 2021

(65) Prior Publication Data
US 2022/0028806 A1    Jan. 27, 2022

Related U.S. Application Data

(63) Continuation of application No. 16/924,836, filed on Jul. 9, 2020, now Pat. No. 11,183,470.

(30) Foreign Application Priority Data

Apr. 16, 2020  (KR) .......................... 10-2020-0045885

(51) Int. Cl.
*H01L 23/64* (2006.01)
*H01L 23/498* (2006.01)
*H01L 23/00* (2006.01)

(52) U.S. Cl.
CPC ...... *H01L 23/642* (2013.01); *H01L 23/49822* (2013.01); *H01L 23/49838* (2013.01); *H01L 24/16* (2013.01); *H01L 2224/16227* (2013.01); *H01L 2924/19041* (2013.01); *H01L 2924/19103* (2013.01)

(58) Field of Classification Search
CPC .......................... H01L 23/642; H01L 23/5222
See application file for complete search history.

(56) References Cited

U.S. PATENT DOCUMENTS

| 7,177,135 | B2 | 2/2007 | Kim et al. | |
| 10,510,822 | B2 | 12/2019 | Kim et al. | |
| 10,770,535 | B2 | 9/2020 | Kim et al. | |
| 11,183,470 | B2 * | 11/2021 | Lee | ...... H01L 23/642 |
| 2013/0295727 | A1 | 11/2013 | Hsu et al. | |
| 2015/0333054 | A1 | 11/2015 | Chen | |

FOREIGN PATENT DOCUMENTS

| KR | 100535181 B1 | 12/2005 |
| KR | 101971281 B1 | 4/2019 |

* cited by examiner

*Primary Examiner* — Nicholas J Tobergte
(74) *Attorney, Agent, or Firm* — William Park & Associates Ltd.

(57) ABSTRACT

A semiconductor package includes a substrate and a semiconductor chip disposed over the substrate. The substrate includes: a base layer including an upper surface facing the semiconductor chip; an upper ground electrode plate disposed over the upper surface of the base layer and configured to transmit a ground voltage to the semiconductor chip; and a dummy power pattern disposed in the upper ground electrode plate and having a side surface which is surrounded by the upper ground electrode plate and is spaced apart from the upper ground electrode plate with an insulating material between the dummy power pattern and the upper ground electrode plate. A ground voltage transmission path from the upper ground electrode plate to the semiconductor chip is spaced apart from the dummy power pattern.

12 Claims, 10 Drawing Sheets

US 11,715,708 B2

SEMICONDUCTOR PACKAGE INCLUDING DECOUPLING CAPACITOR

CROSS-REFERENCE TO RELATED APPLICATION

This application is a continuation application of U.S. patent application Ser. No. 16/924,836, filed on Jul. 9, 2020, and claims priority under 35 U.S.C. § 119 to Korean Patent Application No. 10-2020-0045885 filed on Apr. 16, 2020, which is incorporated herein by reference in its entirety.

BACKGROUND

1. Technical Field

This patent document relates to a semiconductor package, and more particularly, to a semiconductor package including a decoupling capacitor.

2. Related Art

Recently, demands for high-speed operation and high-capacity data processing of semiconductor devices have increased. For this, it is required to increase the number of signals simultaneously transmitted to the semiconductor device or the signal transmission speed.

However, there is a problem in that power/ground noise increases as the semiconductor device operates at higher speeds and the number of signals simultaneously transmitted increases. To solve this problem, a method of stabilizing power/ground supply by adding a decoupling capacitor is currently widely used.

SUMMARY

In an embodiment, a semiconductor package may include a substrate and a semiconductor chip disposed over the substrate. The substrate includes: a base layer including an upper surface facing the semiconductor chip; an upper ground electrode plate disposed over the upper surface of the base layer and configured to transmit a ground voltage to the semiconductor chip; and a dummy power pattern disposed in the upper ground electrode plate and having a side surface which is surrounded by the upper ground electrode plate and is spaced apart from the upper ground electrode plate with an insulating material between the dummy power pattern and the upper ground electrode plate. A ground voltage transmission path from the upper ground electrode plate to the semiconductor chip is spaced apart from the dummy power pattern.

In another embodiment, a semiconductor package may include a substrate and a semiconductor chip disposed over the substrate. The substrate includes: a base layer including an upper surface facing the semiconductor chip; an upper power electrode plate disposed over the upper surface of the base layer and configured to transmit a power voltage to the semiconductor chip; and a dummy ground pattern disposed in the upper power electrode plate and having a side surface which is surrounded by the upper power electrode plate and is spaced apart from the upper power electrode plate with an insulating material between the dummy ground pattern and upper power electrode plate. A power voltage transmission path from the upper power electrode plate to the semiconductor chip is spaced apart from the dummy ground pattern.

DETAILED DESCRIPTION

Figure 1A:
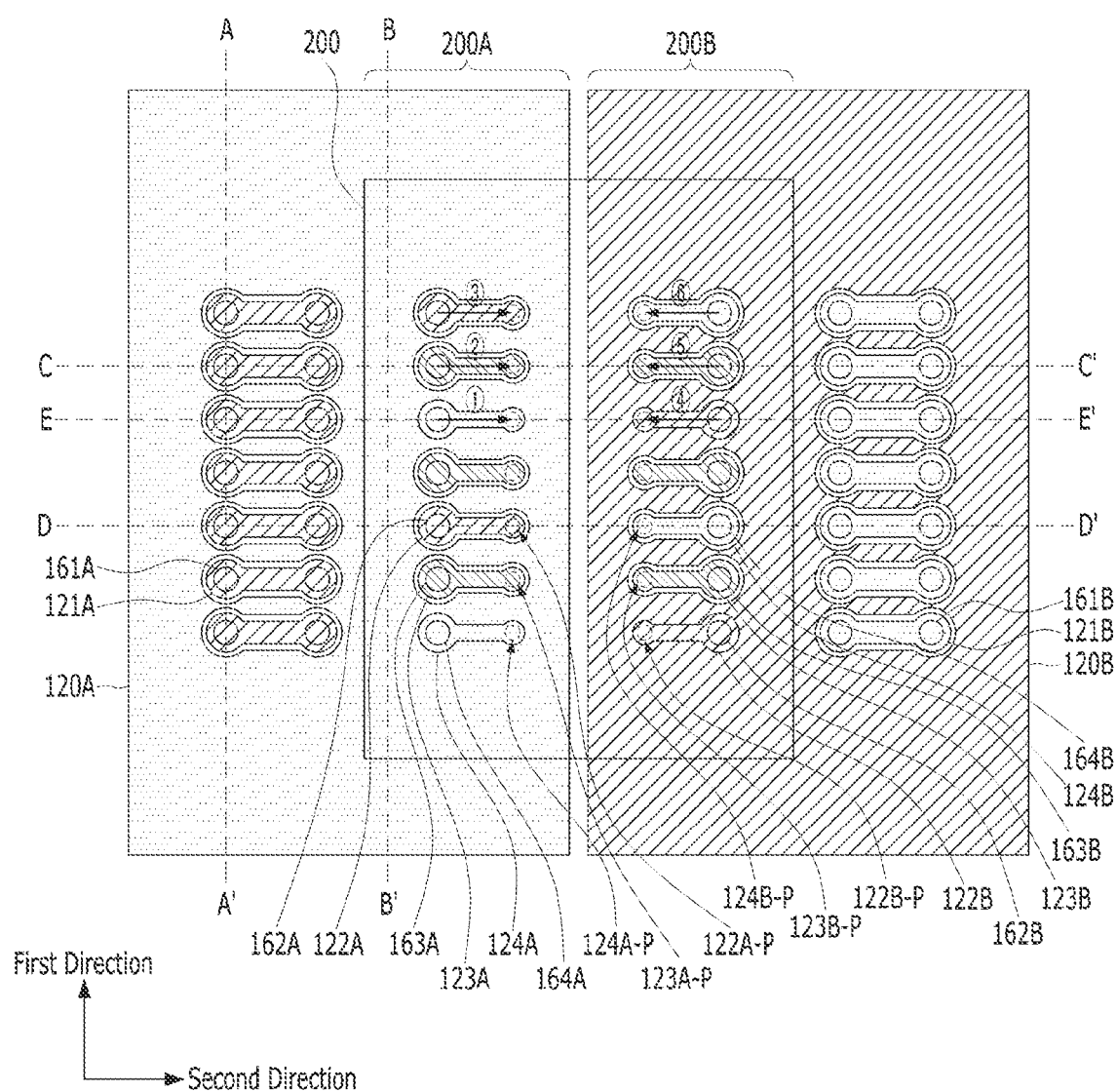
FIGS. 1A and 1B are plan views illustrating an upper wiring layer and a lower wiring layer of a substrate of a semiconductor package according to an embodiment of the present disclosure.

Hereinafter, various examples of embodiments of the disclosure will be described in detail with reference to the accompanying drawings.

The drawings might not be necessarily to scale and in some instances, proportions of at least some structures in the drawings may have been exaggerated in order to clearly illustrate certain features of the described examples or implementations. In presenting a specific example in a drawing or description having two or more layers in a multi-layer structure, the relative position relationship of such layers or the sequence of arranging the layers as shown reflects a particular implementation for the described or illustrated example and a different relative position relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Hereinafter, a semiconductor package according to an embodiment of the present disclosure will be described with reference to FIGS. 1A to 6.

Figure 1B:
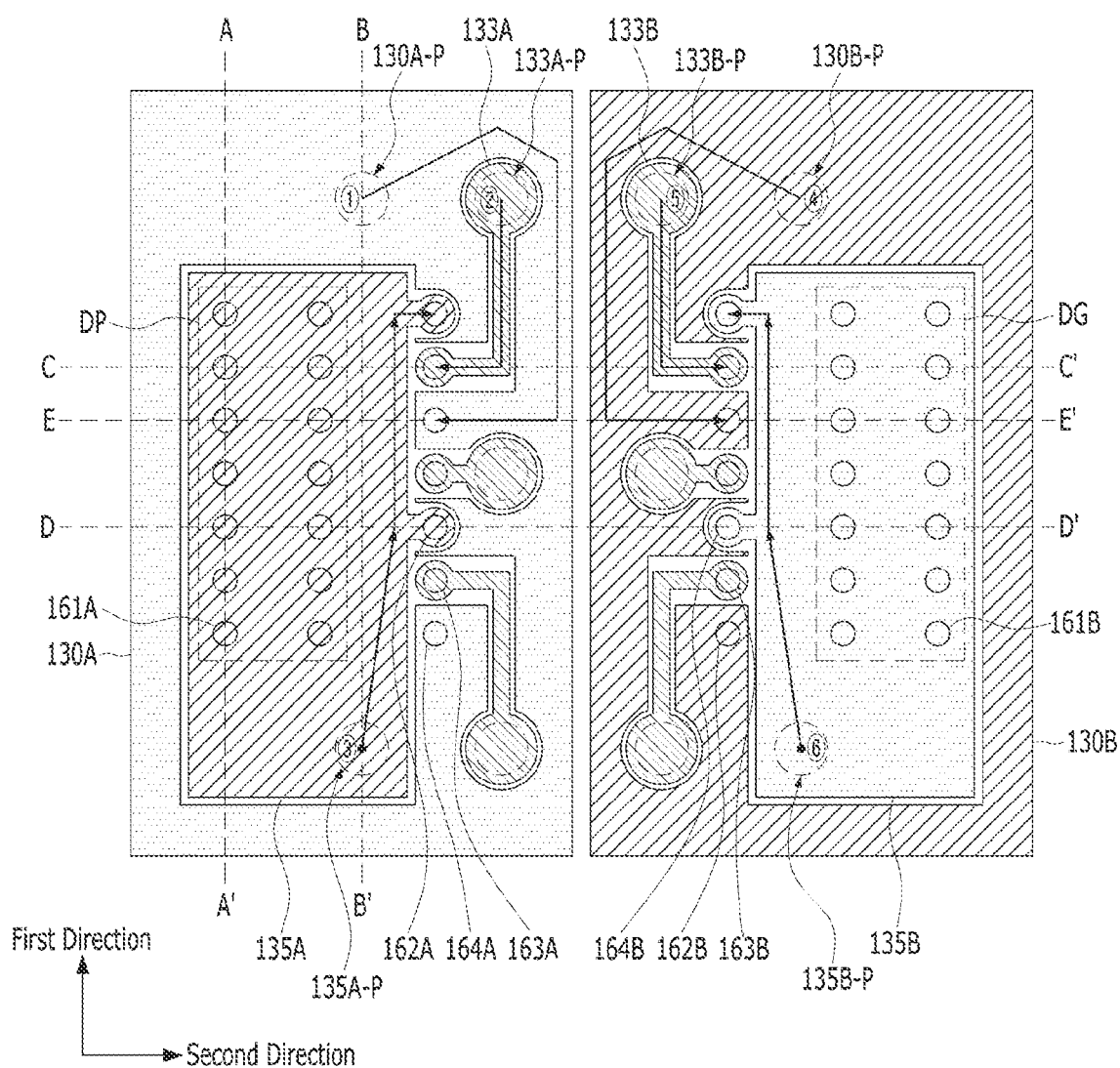
Figure 1C:
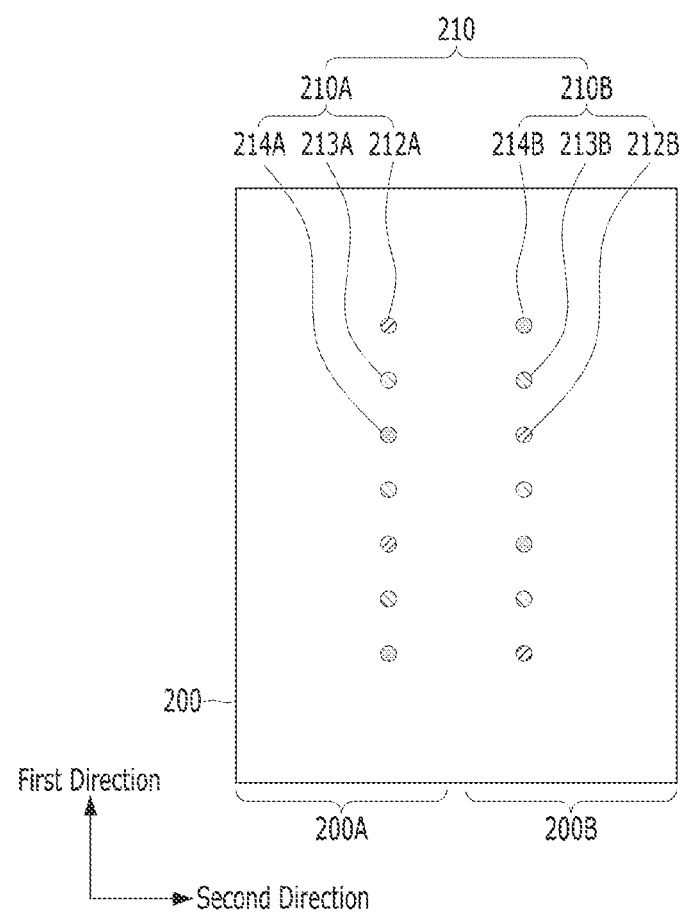
FIG. 1C is a plan view illustrating a semiconductor chip of the semiconductor package according to the embodiment of the present disclosure.
Figure 2:
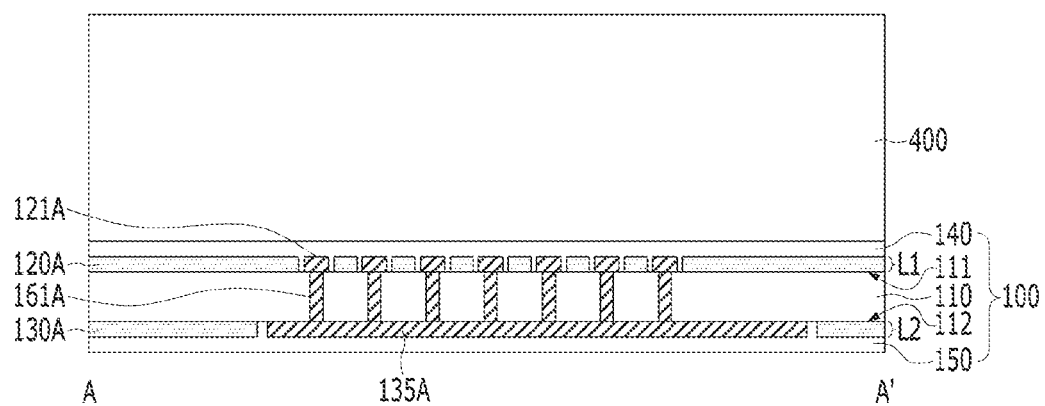
FIG. 2 is a cross-sectional view taken with reference to a line A-A' of FIGS. 1A and 1B.
Figure 3:
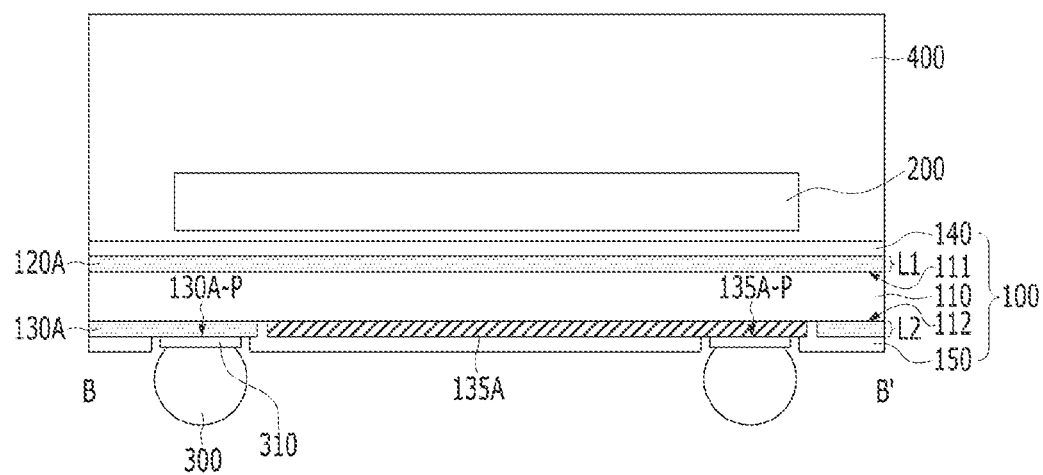
FIG. 3 is a cross-sectional view taken with reference to a line B-B' of FIGS. 1A and 1B.
Figure 4:
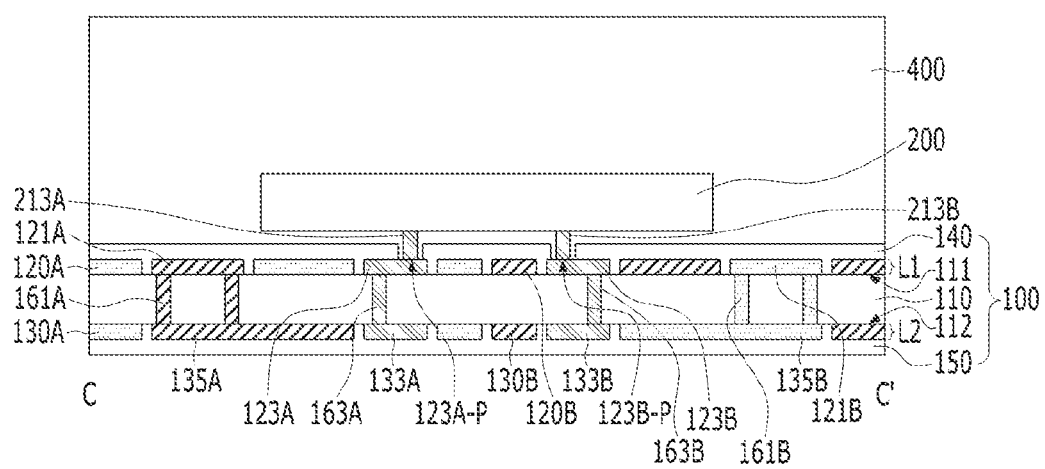
FIG. 4 is a cross-sectional view taken with reference to a line C-C' of FIGS. 1A and 1B.
Figure 5:
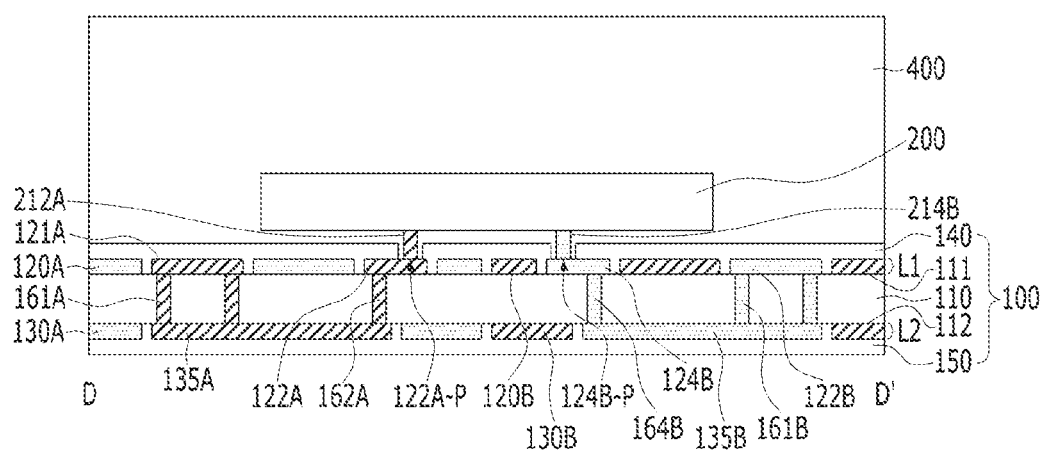
FIG. 5 is a cross-sectional view taken with reference to a line D-D' of FIGS. 1A and 1B.
Figure 6:
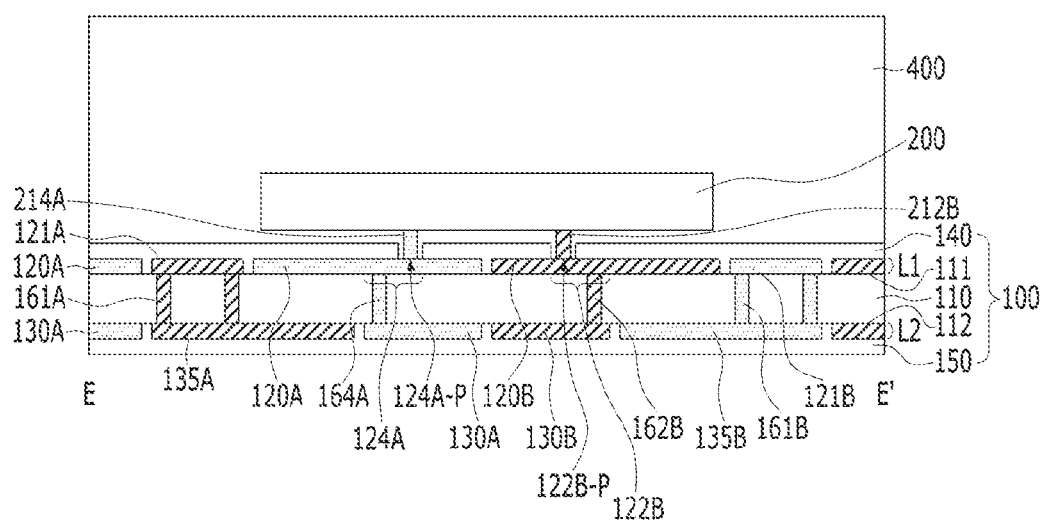
FIG. 6 is a cross-sectional view taken with reference to a line E-E' of FIGS. 1A and 1B.

FIGS. 1A and 1B are plan views illustrating an upper wiring layer and a lower wiring layer of a substrate of a semiconductor package according to an embodiment of the present disclosure, and FIG. 1C is a plan view illustrating a semiconductor chip of the semiconductor package according to the embodiment of the present disclosure. For reference, the semiconductor chip is also illustrated in FIG. 1A for convenience of description. Also, vias between the upper wiring layer and the lower wiring layer are illustrated in FIGS. 1A and 1B. FIG. 1C shows a lower surface of the semiconductor chip. FIGS. 2 to 5 are cross-sectional views illustrating the semiconductor package according to the embodiment of the present disclosure. FIG. 2 is a cross-sectional view taken with reference to a line A-A' of FIGS. 1A and 1B, FIG. 3 is a cross-sectional view taken with reference to a line B-B' of FIGS. 1A and 1B, FIG. 4 is a cross-sectional view taken with reference to a line C-C' of FIGS. 1A and 1B, FIG. 5 is a cross-sectional view taken with reference to a line D-D' of FIGS. 1A and 1B, and FIG. 6 is a cross-sectional view taken with reference to a line E-E' of FIGS. 1A and 1B. A direction parallel to the line A-A' and the line B-B' will be referred to as a first direction, and a direction parallel to the line C-C' and the line D-D' and perpendicular to the first direction will be referred to as a second direction. If necessary, the description will be made while referring to all or part of the drawings.

First, referring to FIGS. 2 to 6, the semiconductor package of the present embodiment may include a substrate 100 and a semiconductor chip 200 disposed over the substrate 100.

Here, the substrate 100 may have a circuit and/or a wiring structure for electric signal transmission between the semiconductor chip 200 and an external connection terminal (see '300' of FIG. 3) described below. As an example, the substrate 100 may be a printed circuit board (PCB).

The semiconductor chip 200 may overlap a portion of the substrate 100 over the substrate 100. Referring to FIGS. 1A and 1C together, the semiconductor chip 200 may include a first region 200A and a second region 200B arranged in the second direction. The first region 200A may be a region overlapping an upper ground electrode plate 120A, which will be described later, and the second region 200B may be a region overlapping an upper power electrode plate 120B, which will be described later.

Also, the semiconductor chip 200 may receive various powers or signals from the substrate 100 and perform various operations accordingly. To this end, referring to FIG. 1C further, the semiconductor chip 200 may include a plurality of connection terminals 210 for connecting to the substrate 100 and receiving the power or signals from the substrate 100. As an example, the connection terminal 210 may be a conductive bump formed over a lower surface of the semiconductor chip 200, which faces the substrate 100. The connection terminals 210 may include first connection terminals 210A disposed in the first region 200A and second connection terminals 210B disposed in the second region 200B. As an example, the number of the first connection terminals 210A and the number of the second connection terminals 210B may be the same. In addition, as an example, the first connection terminals 210A may be arranged in a line along the first direction, and the second connection terminals 210B may be arranged in a line along the first direction. However, the shape, arrangement, number, or the like of the connection terminals 210 in the first region 200A and the second region 200B may be variously modified. The first connection terminals 210A may include a first power terminal 212A to which a power voltage is applied, a first signal terminal 213A to which a signal is applied, and a first ground terminal 214A to which a ground voltage is applied. In addition, the second connection terminals 210B may include a second power terminal 212B to which a power voltage is applied, a second signal terminal 213B to which a signal is applied, and a second ground terminal 214B to which a ground voltage is applied.

The semiconductor chip 200 may be a memory chip including non-volatile memory, such as NAND flash memory, phase-change random-access memory (PRAM), magnetoresistive random-access memory (MRAM), and the like, or volatile memory, such as dynamic random-access memory (DRAM), static random-access memory (SRAM), and the like. However, the present disclosure is not limited thereto, and the semiconductor chip 200 may include various active elements, passive elements, logic circuits, or the like.

The substrate 100 may have a wiring structure for transmitting a power voltage, a ground voltage, and a signal to the semiconductor chip 200. As an example, the substrate 100 includes a base layer 110, an upper wiring layer L1, and an upper insulating layer 140 formed over an upper surface 111 of the base layer 110, and a lower wiring layer L2 and a lower insulating layer 150 formed over a lower surface 112 of the base layer 110.

The base layer 110 may have a plate shape including the upper surface 111 facing the semiconductor chip 200, the lower surface 112 positioned opposite to the upper surface 111, and a side surface connecting the upper surface 111 and the lower surface 112. The base layer 110 may form a body or core of the substrate 100 and may include an insulating material such as epoxy resin, polyimide, or the like.

The upper wiring layer L1 may be formed over the upper surface 111 of the base layer 110. The upper wiring layer L1 may have various shapes and may include a plurality of conductive patterns that receive various powers or signals. The conductive pattern may include various conductive materials such as a metal, a metal nitride, or the like. As an example, referring to FIG. 1A further, the upper wiring layer L1 may include the upper ground electrode plate 120A and the upper power electrode plate 120B formed adjacent to each other while being spaced apart from each other. In particular, the upper ground electrode plate 120A may be disposed at one side, for example, at a left side in the second direction, and the upper power electrode plate 120B may be disposed at the other side, for example, at a right side in the second direction.

The upper ground electrode plate 120A may be for transmitting a ground voltage to the semiconductor chip 200 and may have a plate shape. In particular, referring to FIGS. 1A and 1C together, the upper ground electrode plate 120A may overlap the first region 200A of the semiconductor chip 200 and be connected to the first ground terminal 214. For convenience of description, the connection between the upper ground electrode plate 120A and the first ground terminal 214A will be described after describing a first upper power pattern 122A and a first upper signal pattern 123A.

Referring to FIGS. 1A, 1C, and 5 together, the first upper power pattern 122A may be formed in the upper ground electrode plate 120A.

The first upper power pattern 122A may be for transmitting a power voltage to the semiconductor chip 200. In particular, the first upper power pattern 122A may overlap the first region 200A of the semiconductor chip 200 and be connected to the first power terminal 212A. The reason for forming the first upper power pattern 122A in the upper ground electrode plate 120A is because the first power terminal 212A is disposed in the first region 200A of the semiconductor chip 200, which overlaps the upper ground electrode plate 120A. If the first upper power pattern 122A is not present in the upper ground electrode plate 120A, a power supply path should be formed from the upper power electrode plate 120B to the first power terminal 212A that does not overlap the upper power electrode plate 120B. Therefore, in this case, a problem may occur that a length of the power supply path is long, and a forming process of the power supply path is difficult. However, in the present embodiment, this problem can be solved.

The first upper power pattern 122A may have an island shape in a plan view. Here, the island shape may mean an isolated shape that is not connected to other components. The first upper power pattern 122A may be in a state where a side surface is surrounded by the upper ground electrode plate 120A and spaced apart from the upper ground electrode plate 120A. Because the first upper power pattern 122A and the upper ground electrode plate 120A are insulated from each other, a space between the first upper power pattern 122A and the upper ground electrode plate 120A may be filled with an upper insulating layer 140.

A lower surface of the first upper power pattern 122A may be connected to a first power via 162A, which will be described later, and an upper surface of the first upper power pattern 122A may be connected to the first power terminal 212A. Particularly, in order to connect the first upper power pattern 122A and the first power terminal 212A, a portion of the upper surface of the first upper power pattern 122A may be exposed by an opening formed in the upper insulating layer 140. The portion of the upper surface of the first upper power pattern 122A, exposed by the opening, will be referred to as a first upper power pad 122A-P. The first power terminal 212A may contact the first upper power pad 122A-P through the opening formed in the upper insulating layer 140. The first upper power pattern 122A may have a bar shape that is long in the second direction and short in the first direction in a plan view. In particular, as shown in the plan view of FIG. 1A, the first upper power pattern 122A may include a line portion and end portions. The line portion may extend in the second direction and have a relatively narrow width. The end portions may be positioned at both ends of the line portion and have a relatively large width compared to the line portion. In this case, one of the end portions, for example, a left end portion, may overlap and/or connect with the first power via 162A, and the other of the end portions, for example, a right end portion, may overlap and/or connect with the first power terminal 212A.

In addition, referring to FIGS. 1A, 1C, and 4 together, the first upper signal pattern 123A may be formed in the upper ground electrode plate 120A.

The first upper signal pattern 123A may be for transmitting a signal to the semiconductor chip 200. In particular, the first upper signal pattern 123A may overlap the first region 200A of the semiconductor chip 200 and be connected to the first signal terminal 213A. The reason for forming the first upper signal pattern 123A in the upper ground electrode plate 120A is because the first signal terminal 213A is disposed in the first region 200A of the semiconductor chip 200, which overlaps the upper ground electrode plate 120A. If the first upper signal pattern 123A is not present in the upper ground electrode plate 120A, a signal transmission path should be formed via another place. Therefore, in this case, a problem may occur that a length of the signal transmission path is long, and a forming process of the signal transmission path is difficult. However, in the present embodiment, this problem can be solved.

The first upper signal pattern 123A may have a shape the same as or similar to the first upper power pattern 122A. The first upper signal pattern 123A may have an island shape, and a side surface of the first upper signal pattern 123A may be surrounded by the upper ground electrode plate 120A. However, because the first upper signal pattern 123A and the upper ground electrode plate 120A are insulated from each other, the first upper signal pattern 123A and the upper ground electrode plate 120A may be spaced apart from each other, and a space between the first upper signal pattern 123A and the upper ground electrode plate 120A may be filled with the upper insulating layer 140.

A lower surface of the first upper signal pattern 123A may be connected to a first signal via 163A, which will be described later, and an upper surface of the first upper signal pattern 123A may be connected to the first signal terminal 213A. Particularly, in order to connect the first upper signal pattern 123A and the first signal terminal 213A, a portion of the upper surface of the first upper signal pattern 123A may be exposed by an opening formed in the upper insulating layer 140. The portion of the upper surface of the first upper signal pattern 123A, exposed by the opening, will be referred to as a first upper signal pad 123A-P. The first signal terminal 213A may contact the first upper signal pad 123A-P through the opening formed in the upper insulating layer 140. The first upper signal pattern 123A may have a bar shape that is long in the second direction and short in the first direction in a plan view. In particular, as shown in the plan view of FIG. 1A, the first upper signal pattern 123A may include a line portion and end portions. The line portion may extend in the second direction and have a relatively narrow width. The end portions may be positioned at both ends of the line portion and have a relatively large width compared to the line portion. One of the end portions, for example, a left end portion, may overlap and/or connect with the first signal via 163A, and the other of the end portions, for example, a right end portion, may overlap and/or connect with the first signal terminal 213A.

Meanwhile, referring to FIGS. 1A, 1C, and 6 together, because the upper ground electrode plate 120A overlaps the first ground terminal 214A, an additional ground pattern need not be formed in the upper ground electrode plate 120A. However, in order to connect the upper ground electrode plate 120A and the first ground terminal 214A, a portion of the upper surface of the upper ground electrode plate 120A may be exposed by an opening formed in the upper insulating layer 140. The portion of the upper surface of the upper ground electrode plate 120A, exposed by the opening, will be referred to as a first upper ground pad 124A-P. The lower surface of the upper ground electrode plate 120A may be connected to a first ground via 164A, which will be described later. For convenience of description, a virtual region which has an island shape and overlaps both the first upper ground pad 124A-P and the first ground via 164A is denoted by a solid line and will be referred to as a first upper ground pattern 124A. The first upper ground pattern 124A is a portion of the upper ground electrode plate 120A, and is illustrated in the same shape as the first upper power pattern 122A and/or the first upper signal pattern 123A.

The first upper power pattern 122A, the first upper signal pattern 123A, and the first upper ground pattern 124A may overlap the first region 200A of the semiconductor chip 200, and be arranged in a line along the first direction, as shown in FIG. 1A. Both ends of the first upper power pattern 122A, both ends of the first upper signal pattern 123A, and both ends of the first upper ground pattern 124A may be aligned with each other. Accordingly, the first upper power pad 122A-P, the first upper signal pad 123A-P, and the first upper ground pad 124A-P may be arranged in a line along the first direction, and be connected to the first power terminal 212A, the first signal terminal 213A, and the first ground terminal 214A of the semiconductor chip 200 of FIG. 1C, respectively. As an example, the first power via 162A, the first signal via 163A, and the first ground via 164A may be arranged in a line along the first direction.

Meanwhile, referring to FIGS. 1A, 2, 4, 5, and 6, a dummy power pattern 121A may be further formed in the upper ground electrode plate 120A. The dummy power pattern 121A may be electrically connected to a power supply portion, for example, a lower power pattern 135A, which will be described later. The dummy power pattern 121A might not be used to transmit a power voltage to the semiconductor chip 200 but may be to implement a decoupling capacitor together with the upper ground electrode plate 120A. For this reason, it is referred to as a dummy power pattern 121A to distinguish it from a power electrode plate and/or a power pattern that serves to transmit a power voltage. A lower surface of the dummy power pattern 121A may be connected to a dummy power via 161A. An upper surface of the dummy power pattern 121A may be covered by the upper insulating layer 140.

The dummy power pattern 121A may have an island shape and a side surface of the dummy power pattern 121A may be surrounded by the upper ground electrode plate 120A. However, because the dummy power pattern 121A and the upper ground electrode plate 120A are insulated from each other, the dummy power pattern 121A and the upper ground electrode plate 120A may be spaced apart from each other, and a space between the dummy power pattern 121A and the upper ground electrode plate 120A may be filled with the upper insulating layer 140. The dummy power pattern 121A, the upper ground electrode plate 120A, and the upper insulating layer 140 therebetween may form a decoupling capacitor. The dummy power pattern 121A may have a bar shape having a relatively short length in the first direction and a relatively long length in the second direction. This is to improve a capacitance of the decoupling capacitor by increasing an area of the side surface of the dummy power pattern 121A. In particular, as shown in the plan view of FIG. 1A, the dummy power pattern 121A may have a line portion and end portions. The line portion may extend in the second direction and have a relatively narrow width. The end portions may be positioned at both ends of the line portion and have a relatively large width compared to the line portion. In this case, the end portions of the dummy power pattern 121A may overlap and/or connect with two dummy power vias 161A, respectively. As an example, one of the two dummy power vias 161A may be omitted.

In the present embodiment, the plurality of dummy power patterns 121A may be spaced apart from each other, so that the capacitance of the decoupling capacitor can be further increased. Furthermore, the plurality of dummy power patterns 121A may be arranged in the first direction and may be aligned with each other. This is to increase the number of dummy power patterns 121A to improve the capacitance of the decoupling capacitor while reducing an area of a region where the plurality of dummy power patterns 121A are formed.

The dummy power pattern 121A may be formed in a region other than a region where the first upper power pattern 122A, the first upper signal pattern 123A, and the first upper ground pattern 124A are formed. This is to make the dummy power pattern 121A avoid a power voltage transmission path through the first upper power pattern 122A, a signal transmission path through the first upper signal pattern 123A, and a ground voltage transmission path through the first upper ground pattern 124A. When the dummy power pattern 121A is located in the power voltage transmission path, the signal transmission path, or the ground voltage transmission path, it may interrupt transmission of a power voltage, a signal, or ground voltage. As an example, the dummy power pattern 121A may be disposed in a region of the upper ground electrode plate 120A, which does not overlap the semiconductor chip 200.

Referring again to FIGS. 1A and 1C together, the upper power electrode plate 120B may be for transmitting a power voltage to the semiconductor chip 200 and may have a plate shape. In particular, the upper power electrode plate 120B may overlap the second region 200B of the semiconductor chip 200 and be connected to the second power terminal 212B. For convenience of description, the connection between the upper power electrode plate 120B and the second power terminal 212B will be described after a second upper ground pattern 124B and a second upper signal pattern 123B are described.

Referring to FIGS. 1A, 1C, and 5 together, the second upper ground pattern 124B may be formed in the upper power electrode plate 120B.

The second upper ground pattern 124B may be for transferring a ground voltage to the semiconductor chip 200. In particular, the second upper ground pattern 124B may overlap the second region 200B of the semiconductor chip 200 and be connected to the second ground terminal 214B. The reason for forming the second upper ground pattern 124B in the upper power electrode plate 120B is because the second ground terminal 214B overlaps the upper power electrode plate 120B.

The second upper ground pattern 124B may have an island shape, and a side surface of the second upper ground pattern 124B may be surrounded by the upper power electrode plate 120B. The second upper ground pattern 124B and the upper power electrode plate 120B may be spaced apart from each other, and a space between the second upper ground pattern 124B and the upper power electrode plate 120B may be filled with the upper insulating layer 140.

A lower surface of the second upper ground pattern 124B may be connected to a second ground via 164B, which will be described later, and an upper surface of the second upper ground pattern 124B may be connected to the second ground terminal 214B. A portion of the upper surface of the second upper ground pattern 124B, exposed by an opening formed in the upper insulating layer 140 for the connection between the second upper ground pattern 124B and the second ground terminal 214B, will be referred to as a second upper ground pad 124B-P. The second ground terminal 214B may contact the second upper ground pad 124B-P through the opening formed in the upper insulating layer 140. The second upper ground pattern 124B may have a bar shape that is long in the second direction and short in the first direction in a plan view. In particular, as shown in the plan view of FIG. 1A, the second upper ground pattern 124B may include a line portion and end portions. The line portion may extend in the second direction and have a relatively narrow width. The end portions may be positioned at both ends of the line portion and have a relatively large width compared to the line portion. In this case, one of the end portions, for example, a left end portion, may overlap and/or connect with the second ground terminal 214B, and the other of the end portions, for example, a right end portion, may overlap and/or connect with the second ground via 164B.

In addition, referring to FIGS. 1A, 1C, and 4 together, the second upper signal pattern 123B may be formed in the upper power electrode plate 120B.

The second upper signal pattern 123B may be for transmitting a signal to the semiconductor chip 200. In particular, the second upper signal pattern 123B may overlap the second region 200B of the semiconductor chip 200 and be connected to the second signal terminal 213B. The reason for forming the second upper signal pattern 123B in the upper power electrode plate 120B is because the second signal terminal 213B overlaps the upper power electrode plate 120B.

The second upper signal pattern 123B may have an island shape, and a side surface of the second upper signal pattern 123 may be surrounded by the upper power electrode plate 120B. The second upper signal pattern 123B and the upper power electrode plate 120B may be spaced apart from each other, and a space between the second upper signal pattern 123B and the upper power electrode plate 120B may be filled with the upper insulating layer 140.

A lower surface of the second upper signal pattern 123B may be connected to a second signal via 163B, which will be described later, and an upper surface of the second upper signal pattern 123B may be connected to the second signal terminal 213B. Particularly, a portion of the upper surface of the second upper signal pattern 123B, exposed by an opening formed in the upper insulating layer 140 for the connection between the second upper signal pattern 123B and the second signal terminal 213B, will be referred to as a second upper signal pad 123B-P. The second signal terminal 213B may contact the second upper signal pad 123B-P through the opening formed in the upper insulating layer 140. The second upper signal pattern 123B may have a bar shape that is long in the second direction and short in the first direction in a plan view. In particular, as shown in the plan view of FIG. 1A, the second upper signal pattern 120B may include a line portion and end portions. The line portion may extend in the second direction and have a relatively narrow width. The end portions may be positioned at both ends of the line portion and have a relatively large width compared to the line portion. In this case, one of the end portions, for example, a left end portion may overlap and/or connect with the second signal terminal 213B, and the other of the end portions, for example, a right end portion may overlap and/or connect with the second signal via 163B.

Referring to FIGS. 1A, 1C, and 6 together, because the upper power electrode plate 120B overlaps the second power terminal 212B, an additional power pattern need not be formed in the upper power electrode plate 120B. In order to connect the upper power electrode plate 120B and the second power terminal 212B, a portion of the upper surface of the upper power electrode plate 120B may be exposed by an opening formed in the upper insulating layer 140. The portion of the upper surface of the upper power electrode plate 120B, exposed by the opening, will be referred to as a second upper power pad 122B-P. The lower surface of the upper power electrode plate 120B may be connected to a second power via 162B, which will be described later. For convenience of description, a virtual region which has an island shape and overlaps both the second upper power pad 122B-P and the second power via 162B is denoted by a solid line and will be referred to as a second upper power pattern 122B. The second upper power pattern 122B may be a portion of the upper power electrode plate 120B and is illustrated in the same shape as the second upper ground pattern 124B and/or the second upper signal pattern 123B.

The second upper power pattern 122B, the second upper signal pattern 123B, and the second upper ground pattern 124B may overlap the second region 200B of the semiconductor chip 200 and be arranged in a line along the first direction, as shown in FIG. 1A. Both ends of the second upper power pattern 122B, both ends of the second upper signal pattern 123B, and both ends of the second upper ground pattern 124B may be aligned with each other. Accordingly, the second upper power pad 122B-P, the second upper signal pad 123B-P, and the second upper ground pad 124B-P may be arranged in a line along the first direction, and be connected to the second power terminal 212B, the second signal terminal 213B, and the second ground terminal 214B of the semiconductor chip 200 of FIG. 2, respectively. As an example, the second power via 162B, the second signal via 163B, and the second ground via 164B may be arranged in a line along the first direction.

Meanwhile, referring to FIGS. 1A, 1C, 4, 5 and 6 together, a dummy ground pattern 121B may be further formed in the upper power electrode plate 120B. The dummy ground pattern 121B may be electrically connected to a ground voltage supply portion, for example, a lower ground pattern 135B, which will be described later. The dummy ground pattern 121B might not be used to transmit the ground voltage to the semiconductor chip 200 but may be to implement the decoupling capacitor together with the upper power electrode plate 120B. For this reason, it is referred to as a dummy ground pattern 121B in order to distinguish it from a ground electrode plate and/or a ground pattern that serves to transmit a ground voltage. A lower surface of the dummy ground pattern 121B may be connected to a dummy ground via 161B. An upper surface of the dummy ground pattern 121B may be covered by the upper insulating layer 140.

The dummy ground pattern 121B may have an island shape, and a side surface of the dummy ground pattern 121B may be surrounded by the upper power electrode plate 120B. The dummy ground pattern 121B and the upper power electrode plate 120B may be spaced apart from each other, and a space between the dummy ground pattern 121B and the upper power electrode plate 120B may be filled with the upper insulating layer 140. The dummy ground pattern 121B, the upper power electrode plate 120B, and the upper insulating layer 140 therebetween may form the decoupling capacitor. The dummy ground pattern 121B may have a bar shape having a relatively short length in the first direction and a relatively long length in the second direction. Furthermore, as shown in the plan view of FIG. 1A, the dummy ground pattern 121B may include a line portion and end portions. The line portion may extend in the second direction and have a relatively narrow width. The end portions may be positioned at both ends of the line portion and have a relatively large width compared to the line portion. In this case, the end portions of the dummy ground pattern 121B may overlap and/or connect with two dummy ground vias 161B, respectively. As an example, one of the two dummy ground vias 161B may be omitted.

In the present embodiment, a plurality of dummy ground patterns 121B may be arranged to be spaced apart from each other. Furthermore, the plurality of dummy ground patterns 121B may be arranged in the first direction and may be aligned with each other.

The dummy ground pattern 121B is formed in a region other than a region where the second upper power pattern 122B, the second upper signal pattern 123B, and the second upper ground pattern 124B are formed. Thus, the dummy ground pattern 124B may avoid a voltage or signal transmission path through the second upper power pattern 122B, the second upper signal pattern 123B, or the second upper ground pattern 124B. As an example, the dummy ground pattern 121B may be disposed in a region of the upper power electrode plate 120B, which does not overlap the semiconductor chip 200.

The lower wiring layer L2 may be formed over the lower surface 112 of the base layer 110 and may include a plurality of conductive patterns receiving various powers or signals.

As an example, referring to FIG. 1B further, the lower wiring layer L2 may include a lower ground electrode plate 130A and a lower power electrode plate 130B formed adjacent to each other while being spaced apart from each other. The lower ground electrode plate 130A may be disposed at one side, for example, at a left side in the second direction, and the lower power electrode plate 130B may be disposed at the other side, for example, at a right side in the second direction.

Referring to FIGS. 1A and 1B together, the lower ground electrode plate 130A may be for transmitting the ground voltage to the upper ground electrode plate 120A, particularly, the first upper ground pattern 124A. To this end, an upper surface of the lower ground electrode plate 130A may be connected to the first ground via 164A. The lower ground electrode plate 130A may have a plate shape and may be disposed to overlap and face the upper ground electrode plate 120A.

Referring to FIGS. 1B, 2, 3, 4, 5, and 6 together, a lower power pattern 135A may be formed in the lower ground electrode plate 130A.

The lower power pattern 135A may be for transmitting a power voltage to the first upper power pattern 122A and the dummy power pattern 121A shown in FIG. 1A. To this end, an upper surface of the lower power pattern 135A may be connected to the dummy power via 161A and the first power via 162A. The lower power pattern 135A may include a plate portion and a protruding portion. The plate portion may overlap the plurality of dummy power vias 161A simultaneously. The protruding portion may protrude in a direction toward the first power via 162A, for example, in a right direction, for connection with the first power vias 162A.

The lower power pattern 135A may have a side surface surrounded by the lower ground electrode plate 130A. The lower power pattern 135A and the lower ground electrode plate 130A may be spaced apart from each other, and a space between the lower power pattern 135A and the lower ground electrode plate 130A may be filled with the lower insulating layer 150.

In addition, referring to FIGS. 1B and 4 together, a first lower signal pattern 133A may be formed in the lower ground electrode plate 130A.

The first lower signal pattern 133A may be for transmitting a signal to the first upper signal pattern 123A shown in FIG. 1A. To this end, an upper surface of the first lower signal pattern 133A may be connected to the first signal via 163A. The first lower signal pattern 133A may include one end for connection with the first signal via 163A, a line portion extending in a predetermined direction from the one end, and the other end located opposite to the one end while being connected to the line portion. The first lower signal pattern 133A may extend in any direction within the lower ground electrode plate 130A, except for a region occupied by the lower power pattern 135A and the first ground via 164A.

A side surface of the first lower signal pattern 133A may be surrounded by the lower ground electrode plate 130A. The first lower signal pattern 133A and the lower ground electrode plate 130A may be spaced apart from each other, and a space between the first lower signal pattern 133A and the lower ground electrode plate 130A may be filled with the lower insulating layer 150.

Meanwhile, referring to FIGS. 1B and 3 together, lower surfaces of the lower ground electrode plate 130A, the lower power pattern 135A, and the first lower signal pattern 133A may be connected to external connection terminals 300. For the connection between the lower ground electrode plate 130A and the external connection terminal 300, a portion of the lower surface of the lower ground electrode plate 130A may be exposed by an opening formed in the lower insulating layer 150. The portion of the lower surface of the lower ground electrode plate 130A, exposed by the opening, will be referred to as a first lower ground pad 130A-P. In addition, a portion of the lower surface of the lower power pattern 135A, exposed by an opening formed in the lower insulating layer 150 for the connection between the lower power pattern 135A and the external connection terminal 300, will be referred to as a first lower power pad 135A-P. In addition, a portion of the lower surface of the first lower signal pattern 133A, exposed by an opening formed in the lower insulating layer 150 for the connection between the first lower signal pattern 133A and the external connection terminal 300, will be referred to as a first lower signal pad 133A-P.

The first lower ground pad 130A-P, the first lower signal pad 133A-P, and the first lower power pad 135A-P may have a much larger planar area than the above-described pads 122A-P, 123A-P, and 124A-P of the upper wiring layer L1 of FIG. 1A. This is because the first lower ground pad 130A-P, the first lower signal pad 133A-P, and the first lower power pad 135A-P function as a ball land for connection with a solder ball used as the external connection terminal 300.

Accordingly, referring to FIGS. 1A to 1C together, a current path transmitting the ground voltage may be formed from the external connection terminal 300 connected to the first lower ground pad 130A-P to the first ground terminal 214A of the semiconductor chip 200 (see arrow ①). Specifically, the current path ① may be formed to pass through the external connection terminal 300 connected to the first lower ground pad 130A-P, the lower ground electrode plate 130A, the first ground via 164A, the first upper ground pattern 124A, and the first ground terminal 214A connected to the first upper ground pad 124A-P. Here, the current path ① is generally formed to have the shortest length. This is because a current flows in a path with the lowest resistance, that is, in the shortest path. Therefore, the current path ① in the lower ground electrode plate 130A may be shifted from the lower power pattern 135A or the first lower signal pattern 133A, and may have the shortest path from the first lower ground pad 130A-P to the first ground via 164A. The first lower ground pad 130A-P may be located anywhere in the lower ground electrode plate 130A.

In addition, a current path for transmitting a signal may be formed from the external connection terminal 300 connected to the first lower signal pad 133A-P to the first signal terminal 213A of the semiconductor chip 200 (see arrow ②). Specifically, the current path ② may be formed to pass through the external connection terminal 300 connected to the first lower signal pad 133A-P, the first lower signal pattern 133A, the first signal via 163A, the first upper signal pattern 123A, and the first signal terminal 213A connected to the first upper signal pad 123A-P.

In addition, a current path for transmitting a power voltage may be formed from the external connection terminal 300 connected to the first lower power pad 135A-P to the first power terminal 212A of the semiconductor chip 200 (see arrow ③). Specifically, the current path ③ may be formed to pass through the external connection terminal 300 connected to the first lower power pad 135A-P, the lower power pattern 135A, the first power via 162A, the first upper power pattern 122A, and the first power terminal 212A connected to the first upper power pad 122A-P. In general, the current path ③ may be formed to have the shortest length. Accordingly, the current path ③ in the lower power pattern 135A may have a straight path connecting the first lower power pad 135A-P and the first power via 162A.

Meanwhile, as described above, the region in which the dummy power pattern 121A is formed should avoid a current path for transmitting a power voltage, a ground voltage, and a signal. The current path ① and the current path ② have no way of meeting the region in which the dummy power pattern 121A is formed. However, it is possible that the current path ③ meets the region in which the dummy power pattern 121A is formed. This is because both the dummy power via 161A connected to the dummy power pattern 121A and the first power via 162A connected to the first upper power pattern 122A overlap and connect with the lower power pattern 135A. For this reason, when a region surrounding all of the plurality of dummy power vias 161A is referred to as a dummy power region DP, the first lower power pad 135A-P may be positioned outside the dummy power region DP. Also, the current path ③ in the lower power pattern 135A may be located outside the dummy power region DP.

Referring to FIGS. 1A and 1B together, the lower power electrode plate 130B may be for transmitting a power voltage to the upper power electrode plate 120B, particularly, the second upper power pattern 122B. To this end, an upper surface of the lower power electrode plate 130B may be connected to the second power via 162B. The lower power electrode plate 130B may have a plate shape and may be disposed to overlap and face the upper power electrode plate 120B.

Referring to FIGS. 1B, 4, 5, and 6 together, a lower ground pattern 135B may be formed in the lower power electrode plate 130B.

The lower ground pattern 135B may be for transferring a ground voltage to the second upper ground pattern 124B and the dummy ground pattern 121B of FIG. 1A. To this end, an upper surface of the lower ground pattern 135B may be connected to the dummy ground via 161B and the second ground via 164B. The lower ground pattern 135B may include a plate portion and a protruding portion. The plate portion may overlap the plurality of dummy ground vias 161B simultaneously. The protruding portion may protrude in a direction toward the second ground via 164B, for example, in a left direction, for connection with the second ground via 164B.

The lower ground pattern 135B may have a side surface surrounded by the lower power electrode plate 130B. The lower ground pattern 135B and the lower power electrode plate 130B may be spaced apart from each other, and a space between the lower ground pattern 135B and the lower power electrode plate 130B may be filled with the lower insulating layer 150.

In addition, referring to FIGS. 1B and 4 together, a second lower signal pattern 133B may be formed in the lower power electrode plate 130B.

The second lower signal pattern 133B may be for transmitting a signal to the second upper signal pattern 123B of FIG. 1A. To this end, an upper surface of the second lower signal pattern 133B may be connected to the second signal via 163B. The second lower signal pattern 133B may include one end for connection with the second signal via 163B, a line portion extending from the one end in a predetermined direction, and the other end located opposite to the one end while being connected to the line portion. The second lower signal pattern 133B may extend in any direction in the lower power electrode plate 130B, except for a region occupied by the lower ground pattern 135B and the second power via 162B.

A side surface of the second lower signal pattern 133B may be surrounded by the lower power electrode plate 130B. The second lower signal pattern 133B and the lower power electrode plate 130B may be spaced apart from each other, and a space between the second lower signal pattern 133B and the lower power electrode plate 130B may be filled with the lower insulating layer 150.

Meanwhile, referring to FIGS. 1B and 3 together, lower surfaces of the lower power electrode plate 130B, the lower ground pattern 135B, and the second lower signal pattern 133B may be connected to the external connection terminals 300. A portion of the lower surface of the lower power electrode plate 130B, exposed by an opening formed in the lower insulating layer 150 for the connection between the lower power electrode plate 130B and the external connection terminal 300, will be referred to as a second lower power pad 130B-P. In addition, a portion of the lower surface of the lower ground pattern 135B, exposed by an opening formed in the lower insulating layer 150 for the connection between the lower ground pattern 135B and the external connection terminal 300, will be referred to as a second lower ground pad 135B-P. In addition, a portion of the lower surface of the second lower signal pattern 133B, exposed by an opening formed in the lower insulating layer 150 for the connection between the second lower signal pattern 133B and the external connection terminal 300, will be referred to as a lower signal pad 133B-P.

Accordingly, referring to FIGS. 1A to 1C together, a current path for transmitting a power voltage may be formed from the external connection terminal 300 connected to the second lower power pad 130B-P to the second power terminal 212B of the semiconductor chip 200 (see arrow ④).

In addition, a current path for transmitting a signal may be formed from the external connection terminal 300 connected to the second lower signal pad 133B-P to the second signal terminal 213B of the semiconductor chip 200 (see arrow ⑤).

In addition, a current path for transmitting a ground voltage may be formed from the external connection terminal 300 connected to the second lower ground pad 135B-P to the second ground terminal 214B of the semiconductor chip 200 (see arrow ⑥). In particular, when a region surrounding all of the plurality of dummy ground vias 161B is referred to as a dummy ground region DG, the second lower ground pad 135B-P may be located outside the dummy ground region DG. Also, the current path ⑥ in the lower ground pattern 135B may be located outside the dummy ground region DG.

The upper wiring layer L1 and the lower wiring layer L2 described above may be connected to each other by conductive vias penetrating the base layer 110. The conductive via may be formed of a conductive material such as a metal. Specifically, referring to FIGS. 1A, 1B, and 6, the upper ground electrode plate 120A and the lower ground electrode plate 130A may be connected by the first ground via 164A. Referring to FIGS. 1A, 1B, 2, 4, 5, and 6, the dummy power pattern 121A and the lower power pattern 135A may be connected by the dummy power via 161A. Referring to FIGS. 1A, 1B, and 5, the first upper power pattern 122A and the lower power pattern 135A may be connected by the first power via 162A. Referring to FIGS. 1A, 1B, and 4, the first upper signal pattern 123A and the first lower signal pattern 133A may be connected by the first signal via 163A.

Referring to FIGS. 1A, 1B, and 6, the upper power electrode plate 120B and the lower power electrode plate 130B may be connected by the second power via 162B. Referring to FIGS. 1A, 1B, and 4, the second upper signal pattern 123B and the second lower signal pattern 133B may be connected by the second signal via 163B. Referring to FIGS. 1A, 1B, 4, 5, and 6, the dummy ground pattern 121B and the lower ground pattern 135B may be connected by the dummy ground via 161B. Referring to FIGS. 1A, 1B, and 5, the second upper ground pattern 124B and the lower ground pattern 135B may be connected by the second ground via 164B.

Referring again to FIGS. 2 to 6, the upper insulating layer 140 and the lower insulating layer 150 may include various openings to expose necessary portions of the upper wiring layer L1 and the lower wiring layer L2. The upper insulating layer 140 and the lower insulating layer 150 may include various insulating materials such as a solder resist, or the like.

Furthermore, referring to FIG. 3, the semiconductor package of the present disclosure may further include the external connection terminal 300.

The external connection terminal 300 may include a solder ball, but the present disclosure is not limited thereto, and a conductive pattern of various shapes and materials may be used as the external connection terminal 300. Furthermore, an interfacial layer 310 may be further formed between the external connection terminal 300 and the lower wiring layer L2 to improve adhesive properties between them and to mitigate thermal and mechanical shock. The interfacial layer 310 may include a metal such as nickel (Ni) or gold (Au).

Referring again to FIGS. 2 to 6, the semiconductor package of the present embodiment may further include an encapsulant 400. The encapsulant 400 may be formed over the substrate 100 to surround the semiconductor chip 200. The encapsulant 400 may include various molding materials such as EMC (Epoxy Molding Compound), or the like.

The semiconductor package described above has the following advantages.

First, a dummy power pattern independent of power supply may be formed in a ground electrode plate of a substrate. Therefore, a decoupling capacitor formed of the ground electrode plate, the dummy power pattern and an insulating material therebetween may be implemented. In addition, a dummy ground pattern independent of ground supply may be formed in a power electrode plate of a substrate. Therefore, a decoupling capacitor formed of the power electrode plate, the dummy ground pattern and an insulating material therebetween may be implemented. As a result, power/ground voltage supply characteristics to the semiconductor chip can be improved.

Further, by arranging the dummy power pattern and/or the dummy ground pattern apart from current paths between a semiconductor chip and the substrate, the dummy power pattern and/or the dummy ground pattern cannot interfere with current transfer between the semiconductor chip and the substrate.

Furthermore, a power pattern and a signal pattern overlapping the semiconductor chip may be additionally formed in the ground electrode plate, and a ground pattern and a signal pattern overlapping the semiconductor chip may be additionally formed in the power electrode plate. Therefore, the current transfer between the semiconductor chip and the substrate can be more efficient.

Figure 7:
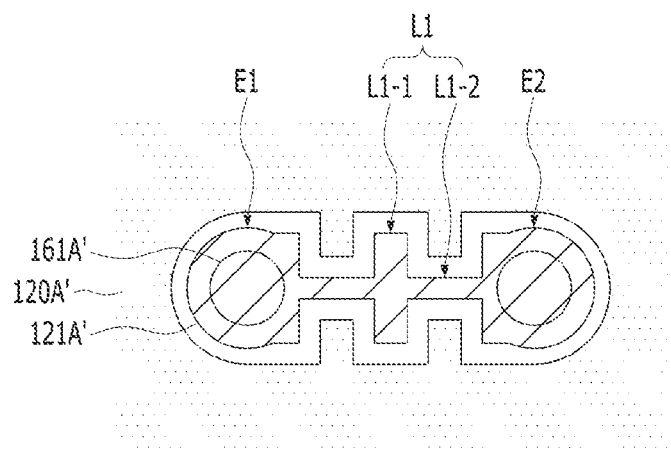
FIG. 7 is a plan view illustrating a shape of a dummy power pattern and a ground electrode plate according to another embodiment of the present disclosure.

FIG. 7 is a plan view illustrating a shape of a dummy power pattern and a ground electrode plate according to another embodiment of the present disclosure.

Referring to FIG. 7, a dummy power pattern 121A' of the present embodiment may include a line portion L1 and end portions E1 and E2. The line portion L1 may extend in the second direction. The end portions E1 and E2 may be located at both ends of the line portion L1 and overlap dummy power vias 161A'.

Here, in the line portion L1 of the dummy power pattern 121A', both side surfaces in the first direction may have an uneven shape. That is, as shown in FIG. 7, the line portion L1 may include a convex portion L1-1 projecting toward an upper ground electrode plate 120A', and a concave portion L1-2 recessed toward an opposite side of the upper ground electrode plate 120A'.

The upper ground electrode plate 120A' may be formed to be spaced apart from the dummy power pattern 121A', and may be formed along a side profile of the dummy power pattern 121A'. Therefore, a side surface of the upper ground electrode plate 120A' may have an uneven shape. That is, a portion of the upper ground electrode plate 120A', corresponding to the concave portion L1-2, may project toward the line portion L1, and another portion of the upper ground electrode plate 120A', corresponding to the convex portion L1-1, may be recessed away from the line portion L1.

The number or shape of the convex and concave portions L1-1 and L1-2 of the line portion L1 may be variously modified unlike that shown. Further, in the present embodiment, both sides of the first direction of the line portion L1 have an uneven shape, but one of the both sides may have an uneven shape, and the other may have a straight shape.

According to the present embodiment, because an opposing area between the side surface of the dummy power pattern 121A' and the side surface of the upper ground electrode plate 120A' increases, a capacitance of a decoupling capacitor formed therefrom may further increase.

Although not illustrated, an upper power electrode plate and a dummy ground pattern formed therein may have similar shapes to the upper ground electrode plate 120A' and the dummy power pattern 121A', respectively.

According to the embodiments of the disclosure, decoupling capacitors are implemented in vertical and horizontal directions in a substrate of a semiconductor package to facilitate power supply.

Figure 8:
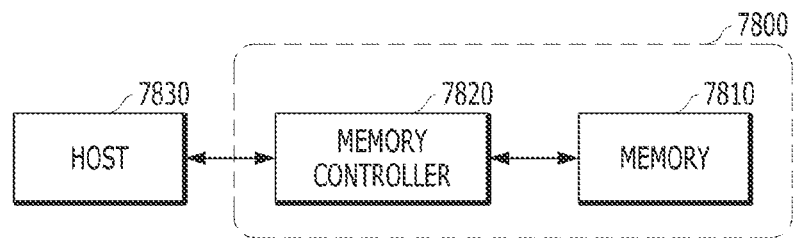
FIG. 8 shows a block diagram illustrating an electronic system employing a memory card including a semiconductor package, according to an embodiment.

FIG. 8 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
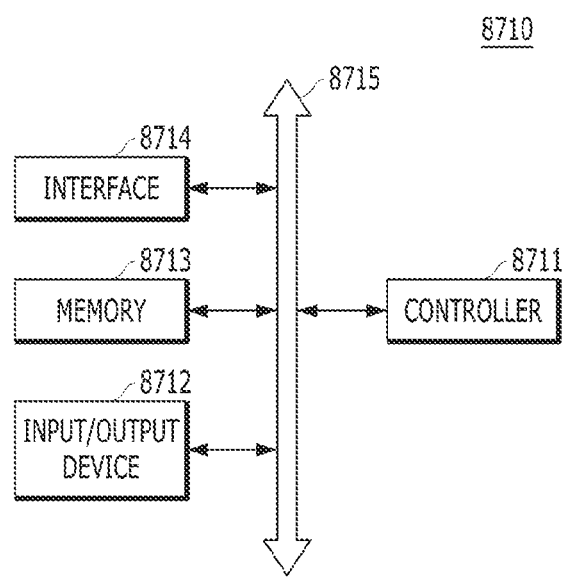
FIG. 9 shows a block diagram illustrating another electronic system including a semiconductor package, according to an embodiment.

FIG. 9 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the disclosure as defined by the following claims.

What is claimed is:
1. A semiconductor package comprising:
a substrate; and
a semiconductor chip disposed over the substrate,
wherein the substrate comprises:
a base layer including an upper surface facing the semiconductor chip;
an upper power electrode plate disposed over the upper surface of the base layer and configured to transmit a power voltage to the semiconductor chip; and
a dummy ground pattern disposed in the upper power electrode plate and having a side surface which is surrounded by the upper power electrode plate and is spaced apart from the upper power electrode plate with an insulating material between the dummy ground pattern and upper power electrode plate, and
wherein a power voltage transmission path from the upper power electrode plate to the semiconductor chip is spaced apart from the dummy ground pattern.

2. The semiconductor package according to claim 1, wherein the dummy ground pattern comprises a plurality of dummy ground patterns spaced apart from each other, and
the power voltage transmission path is spaced apart from a region surrounding the plurality of dummy ground patterns.

3. The semiconductor package according to claim 1, wherein, in a plan view, the dummy ground pattern has a bar shape having a relatively short length in a first direction and a relatively long length in a second direction perpendicular to the first direction.

4. The semiconductor package according to claim 3, wherein the dummy ground pattern comprises a plurality of dummy ground patterns spaced apart from each other, and
the plurality of dummy ground patterns are arranged in a line in the first direction.

5. The semiconductor package according to claim 3, wherein the side surface of the dummy power pattern includes concave and convex portions.

6. The semiconductor package according to claim 1, wherein the semiconductor chip includes a second power terminal disposed on a lower surface of the semiconductor chip facing the substrate,
the second power terminal overlaps and connects with a portion of an upper surface of the upper power electrode plate, and
the dummy ground pattern is disposed in a region that does not overlap the semiconductor chip.

7. The semiconductor package according to claim 1, wherein the substrate further comprises:
a second upper signal pattern and a second upper ground pattern, each disposed in the upper power electrode plate and having a side surface which is surrounded by the upper power electrode plate and is spaced apart from the upper power electrode plate by an insulating material, and
wherein the second upper signal pattern is configured to transmit a signal to the semiconductor chip,
the second upper ground pattern is configured to transmit a ground voltage to the semiconductor chip, and
a signal transmission path from the second upper signal pattern to the semiconductor chip and a ground voltage transmission path from the second upper ground pattern to the semiconductor chip are spaced apart from the dummy ground pattern.

8. The semiconductor package according to claim 7, wherein the semiconductor chip includes a second signal terminal and a second ground terminal disposed on a lower surface of the semiconductor chip facing the substrate,
the second signal terminal overlaps and connects with a portion of an upper surface of the second upper signal pattern,
the second ground terminal overlaps and connects with a portion of an upper surface of the second upper ground pattern, and
the dummy ground pattern is disposed in a region that does not overlap the semiconductor chip.

9. The semiconductor package according to claim 1, wherein the substrate further comprises:
a lower power electrode plate disposed on a lower surface of the base layer positioned opposite to the upper surface of the base layer and overlapping the upper power electrode plate;

a second power via penetrating the base layer and having both ends connected to the upper power electrode plate and the lower power electrode plate, respectively, the second power via configured to transmit the power voltage from the lower power electrode plate to the upper power electrode plate;

a lower ground pattern disposed in the lower power electrode plate and having a side surface which is surrounded by the lower power electrode plate and is spaced apart from the lower power electrode plate with an insulating material between the lower ground pattern and the lower power electrode plate; and a dummy ground via penetrating the base layer and having both ends connected to the dummy ground pattern and the lower ground pattern, respectively, the dummy ground via configured to transmit a ground voltage from the lower ground pattern to the dummy ground pattern.

10. The semiconductor package according to claim 9, wherein the dummy ground pattern comprises a plurality of dummy ground patterns spaced apart from each other, the dummy ground via comprises a plurality of dummy ground vias connected to the plurality of dummy ground patterns, respectively, and the lower ground pattern has a plate shape that overlaps all of the plurality of dummy ground vias.

11. The semiconductor package according to claim 9, wherein the substrate further comprises:

a second upper ground pattern disposed in the upper power electrode plate and having a side surface which is surrounded by the upper power electrode plate and is spaced apart from the upper power electrode plate with an insulating material between the second upper ground pattern and the upper power electrode plate; and a second ground via penetrating the base layer and having both ends connected to the second upper ground pattern and the lower ground pattern, respectively, the second ground via configured to transmit the ground voltage from the lower ground pattern to the second upper ground pattern, wherein a ground voltage transmission path from the lower ground pattern to the second ground via is spaced apart from the dummy ground via.

12. The semiconductor package according to claim 9, wherein the substrate further comprises:

a second upper signal pattern disposed in the upper power electrode plate and having a side surface which is surrounded by the upper power electrode plate and spaced apart from the upper power electrode plate with an insulating material between the second upper signal pattern and the upper power electrode plate;

a second lower signal pattern disposed in the lower power electrode plate and having a side surface which is surrounded by the lower power electrode plate and is spaced apart from the lower power electrode plate with an insulating material between the second lower signal pattern and the lower power electrode plate; and a second signal via penetrating the base layer and having both ends connected to the second upper signal pattern and the second lower signal pattern, respectively.

* * * * *

UNITED STATES PATENT AND TRADEMARK OFFICE
CERTIFICATE OF CORRECTION

| | |
|---|---|
| PATENT NO. | : 11,715,708 B2 |
| APPLICATION NO. | : 17/498177 |
| DATED | : August 1, 2023 |
| INVENTOR(S) | : Jae Hoon Lee and Hyung Ho Cho |

Page 1 of 1

It is certified that error appears in the above-identified patent and that said Letters Patent is hereby corrected as shown below:

In the Specification

Please correct Column 9, Line 28 from "1A, the second upper signal pattern 120B may include a line portion and end portions." to --1A, the second upper signal pattern 123B may include a line portion and end portions.--

In the Claims

In Claim 5, Column 18, Line 21 Please replace: "5. The semiconductor package according to claim 3, wherein the side surface of the dummy power pattern includes concave and convex portions." with --5. The semiconductor package according to claim 3, wherein the side surface of the dummy ground pattern includes concave and convex portions.--

Signed and Sealed this
Eleventh Day of February, 2025

Coke Morgan Stewart
*Acting Director of the United States Patent and Trademark Office*